United States Patent
Chen et al.

(10) Patent No.: US 9,343,398 B2
(45) Date of Patent: May 17, 2016

(54) BGA BALLOUT PARTITION TECHNIQUES FOR SIMPLIFIED LAYOUT IN MOTHERBOARD WITH MULTIPLE POWER SUPPLY RAIL

(71) Applicant: Invensas Corporation, San Jose, CA (US)

(72) Inventors: Yong Chen, Palo Alto, CA (US); Zhuowen Sun, Campbell, CA (US); Kyong-Mo Bang, Fremont, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/497,825

(22) Filed: Sep. 26, 2014

(65) Prior Publication Data

US 2016/0093563 A1 Mar. 31, 2016

(51) Int. Cl.
*H01L 23/498* (2006.01)
*H05K 1/02* (2006.01)

(52) U.S. Cl.
CPC .... *H01L 23/49816* (2013.01); *H01L 23/49838* (2013.01); *H05K 1/0296* (2013.01); *H05K 2201/093* (2013.01); *H05K 2201/09227* (2013.01); *H05K 2201/09309* (2013.01)

(58) Field of Classification Search
CPC .................................................. H01L 23/535
See application file for complete search history.

(56) References Cited

U.S. PATENT DOCUMENTS

| | | | | |
|---|---|---|---|---|
| 4,328,530 A * | 5/1982 | Bajorek | ............... | H01L 23/5383 257/E23.173 |
| 5,672,911 A * | 9/1997 | Patil | ...................... | H01L 23/642 257/691 |
| 6,064,113 A * | 5/2000 | Kirkman | ........... | H01L 23/49827 257/691 |
| 6,479,758 B1 * | 11/2002 | Arima | ............... | H01L 23/49838 174/260 |
| 6,730,860 B2 * | 5/2004 | Searls | ............... | H01L 23/49838 174/260 |
| 6,762,498 B1 * | 7/2004 | Morrison | .......... | H01L 23/49822 257/758 |
| 6,979,897 B2 * | 12/2005 | Ma | ..................... | H01L 23/49822 257/691 |
| 7,233,061 B1 * | 6/2007 | Conn | ...................... | H01L 23/50 257/686 |
| 8,502,084 B2 * | 8/2013 | Song | ....................... | H01L 23/13 174/260 |
| 2006/0055049 A1 * | 3/2006 | Nelson | ............... | H01L 23/49838 257/774 |
| 2013/0143445 A1 * | 6/2013 | Kawakami | ........ | H01L 23/49822 439/626 |
| 2013/0168857 A1 * | 7/2013 | Gregorich | ........... | H01L 25/0657 257/738 |

* cited by examiner

*Primary Examiner* — Lex Malsawma
(74) *Attorney, Agent, or Firm* — Lerner, David, Littenberg, Krumholz & Mentlik, LLP

(57) ABSTRACT

A microelectronic package can include a substrate and a microelectronic element. The substrate can include terminals comprising at least first power terminals and other terminals in an area array at a surface of the substrate. The substrate can also include a power plane element electrically coupled to the first power terminals. The area array can have a peripheral edge and a continuous gap between the terminals extending inwardly from the peripheral edge in a direction parallel to the surface. The terminals on opposite sides of the gap can be spaced from one another by at least 1.5 times a minimum pitch of the terminals. The power plane element can extend within the gap from at least the peripheral edge at least to the first power terminals. Each first power terminal can be separated from the peripheral edge by two or more of the other terminals.

22 Claims, 4 Drawing Sheets

BGA BALLOUT PARTITION TECHNIQUES FOR SIMPLIFIED LAYOUT IN MOTHERBOARD WITH MULTIPLE POWER SUPPLY RAIL

BACKGROUND OF THE INVENTION

The subject matter of the present application relates to microelectronic assemblies, e.g., microelectronic packages that include one or more semiconductor chips having active devices thereon, and more particularly to a microelectronic package design for more simplified power plane element routing.

Microelectronic elements, e.g., semiconductor chips, are thin, flat elements that can incorporate integrated circuits including active semiconductor devices such as transistors, diodes, etc., and wiring that provides electrical interconnections. Semiconductor chips may also or alternatively include passive devices such as capacitors, inductors or resistors. In particular constructions, a microelectronic element can include one or more semiconductor chips having an encapsulant on one or more surfaces thereof and having electrically conductive elements electrically connected with contacts of the one or more semiconductor chips, the contacts being exposed at a surface of the microelectronic element.

Semiconductor chips containing memory storage arrays, particularly dynamic random access memory chips (DRAMs) and flash memory chips are commonly packaged in single- or multiple-chip packages and assemblies. Each package has many electrical connections for carrying signals, power and ground between terminals and the chips therein. The electrical connections can include different kinds of conductors such as horizontal conductors, e.g., traces, beam leads, etc., that extend in a horizontal direction relative to a contact-bearing surface of a chip, vertical conductors such as vias, which extend in a vertical direction relative to the surface of the chip, and wire bonds that extend in both horizontal and vertical directions relative to the surface of the chip.

Conventional microelectronic packages can incorporate a microelectronic element that is configured to predominantly provide memory storage array function, i.e., a microelectronic element that embodies a greater number of active devices to provide memory storage array function than any other function. The microelectronic element may be or include a DRAM chip, or a stacked electrically interconnected assembly of such semiconductor chips. Typically, all of the terminals of such package are placed in sets of columns adjacent to one or more peripheral edges of a package substrate to which the microelectronic element is mounted.

Multiple power plane elements are increasingly common in modern system-on-a-chip ("SoC") chips and packages, and in memory chip packages. For example, LPDDR3 mobile DRAM packages have four power supplies. For mobile applications, it is frequently desirable to have package substrates and circuit panels that have as small of a surface area as possible. There may be very limited space in package substrates and circuit panels for power plane elements, so it is increasingly important that the substrate and circuit panel area be used efficiently.

In light of the foregoing, certain improvements can be made to microelectronic packages to regulate the delivery of power to a microelectronic element, e.g., semiconductor chip, therein in order to improve electrical performance, particularly in assemblies that include such packages and a circuit panel to which such packages can be mounted and electrically interconnected with one another.

BRIEF SUMMARY OF THE INVENTION

In accordance with an aspect of the invention, a microelectronic package can include a substrate and a microelectronic element. The substrate can include a dielectric element having a surface, terminals comprising at least first power terminals and other terminals in an area array at the surface, contacts coupled with the terminals, and traces electrically coupling at least some of the terminals with at least some of the contacts. Each trace can have a minimum lateral dimension parallel to the surface. The substrate can also include a power plane element electrically coupled to the first power terminals and having a minimum lateral dimension parallel to the surface substantially greater than the minimum lateral dimension of each trace.

The microelectronic element can have element contacts electrically coupled with the terminals through the traces and the contacts of the substrate. The area array can have a peripheral edge and a continuous gap between the terminals extending inwardly from the peripheral edge in a direction parallel to the surface. The terminals on opposite sides of the gap can be spaced from one another by at least 1.5 times a minimum pitch of the terminals. The power plane element can extend within the gap from at least the peripheral edge at least to the first power terminals. Each first power terminal can be separated from the peripheral edge by two or more of the other terminals.

In one example, the power plane element and the traces can be coplanar. In a particular embodiment, the terminals on opposite sides of the gap can be spaced from one another by at most 2.5 times the minimum pitch of the terminals. In one embodiment, the peripheral edge can be a first peripheral edge, the area array can have a second peripheral edge opposite the first peripheral edge and third and fourth opposite peripheral edges each extending between the first and second peripheral edges, and each first power terminal can be separated from each of the peripheral edges by two or more of the other terminals.

In a particular example, all of the first power terminals can each be in a clustered configuration with at least one other one of the first power terminals that are electrically connected to the power plane element. In an exemplary embodiment, the power plane element can be electrically isolated from all of the other terminals. In one example, at least some of the other terminals can be configured to carry data signals for at least one of: input to the microelectronic element for input to a memory storage array thereon, or output from the microelectronic element.

In a particular embodiment, a first group of the first power terminals can be disposed on a first side of the gap, and a second group of the first power terminals can be disposed on a second side of the gap opposite first side. In one embodiment, the gap can extend within the area array in a straight line. In a particular example, the gap can extend from the peripheral edge of the area array to a second peripheral edge of the area array, the power plane element can also extend from the first power terminals at least to the second peripheral edge, and each first power terminal can be separated from the second peripheral edge by two or more of the other terminals. In an exemplary embodiment, the microelectronic package may also include a decoupling capacitor electrically coupled to the contacts of the substrate within the gap.

In one example, the power plane element can be a first power plane element and the terminals can also include second power terminals, the substrate further including a second power plane element electrically coupled to the second power terminals and having a minimum lateral dimension parallel to the surface substantially greater than the minimum lateral dimension of each trace. The second power plane element can extend from at least the second power terminals to at least one of: the peripheral edge, or another peripheral edge of the area array, each second power terminal separated from all of the peripheral edges of the area array by two or more of the other terminals, and the second power plane element can be electrically insulated from the first power plane element.

In a particular embodiment, the second power plane element can extend within the gap. In one embodiment, the gap can be a first gap, and the area array can have a second continuous gap between the terminals extending inwardly in a direction parallel to the surface from the at least one of: the peripheral edge, or another peripheral edge of the area array, the terminals on opposite sides of the second gap being spaced from one another by at least 1.5 times the minimum pitch of the terminals, and the second power plane element can extend within the second gap.

In accordance with another aspect of the invention, a microelectronic package can include a substrate and a microelectronic element. The substrate can include a dielectric element having a surface, terminals comprising at least first power terminals and other terminals in an area array at the surface, contacts coupled with the terminals, and traces electrically coupling at least some of the terminals with at least some of the contacts. Each trace can have a minimum lateral dimension parallel to the surface. The substrate can also include a power plane element electrically coupled to the first power terminals and having a minimum lateral dimension parallel to the surface substantially greater than the minimum lateral dimension of each trace.

The microelectronic element can have element contacts electrically coupled with the terminals through the traces and the contacts of the substrate. The area array can have a peripheral edge. The other terminals can include no-connect terminals disposed at relative positions of the area array so as to form a continuous region extending inwardly from the peripheral edge in a direction parallel to the surface. The power plane element can extend within the region from at least the peripheral edge at least to the first power terminals. Each first power terminal can be separated from the peripheral edge by two or more of the other terminals.

In accordance with yet another aspect of the invention, a microelectronic package can include a substrate and a microelectronic element. The substrate can include a dielectric element having a surface, terminals comprising at least first power terminals and other terminals in an area array at the surface, contacts coupled with the terminals, and traces electrically coupling at least some of the terminals with at least some of the contacts. Each trace can have a minimum lateral dimension parallel to the surface. The microelectronic element can have element contacts electrically coupled with the terminals through the traces and the contacts of the substrate.

The area array can have a peripheral edge and a continuous gap between the terminals extending inwardly from the peripheral edge in a direction parallel to the surface. The terminals on opposite sides of the gap being spaced from one another by at least 1.5 times a minimum pitch of the terminals. Each first power terminal can be separated from the peripheral edge by two or more of the other terminals. The first power terminals can be configured to be joined to contacts of a circuit panel that are electrically coupled to a power plane element that extends within the gap from at least the peripheral edge at least to the first power terminals. The power plane element can have a minimum lateral dimension parallel to the surface substantially greater than the minimum lateral dimension of each trace.

In one example, the terminals on opposite sides of the gap can be spaced from one another by at most 2.5 times the minimum pitch of the terminals. In a particular embodiment, the peripheral edge can be a first peripheral edge, the area array can have a second peripheral edge opposite the first peripheral edge and third and fourth opposite peripheral edges each extending between the first and second peripheral edges, and each first power terminal can be separated from each of the peripheral edges by two or more of the other terminals. In one embodiment, a microelectronic assembly can include the circuit panel and the microelectronic package described above. The microelectronic package can be mounted to the circuit panel so that the first power terminals are joined to the contacts of the circuit panel. The power plane element can extend within the gap from at least the peripheral edge at least to the first power terminals.

In a particular example, the power plane element can be a first power plane element and the terminals can also include second power terminals. The circuit panel can also include a second power plane element electrically coupled to the second power terminals and having a minimum lateral dimension parallel to the surface of the substrate substantially greater than the minimum lateral dimension of each trace. The second power plane element can extend from at least the second power terminals to at least one of: the peripheral edge, or another peripheral edge of the area array, each second power terminal separated from all of the peripheral edges of the area array by two or more of the other terminals, and the second power plane element can be electrically insulated from the first power plane element.

In an exemplary embodiment, a system can include the microelectronic package described above and one or more other electronic components electrically connected to the microelectronic package. In one example, the system can also include a housing. The microelectronic package and the other electronic components can be mounted to the housing.

DETAILED DESCRIPTION

With reference to the various Figures as further described herein, a variety of multi-chip microelectronic package configurations are provided that can each have a common package terminal bailout on a surface of the package for interconnection of terminals to a common interface on a circuit panel or other component of a system. In such way, the common interface on the circuit panel or other component can be standardized for connection to all such microelectronic packages, even though the particular microelectronic package may vary significantly from another such microelectronic package in the number of semiconductor memory chips (hereinafter, "chips") therein, the particular type of chip, and the particular standard by which input signals are provided thereto, e.g., address information, or command address bus signals, as well as number of ranks of memory supported by the package.

Certain embodiments of the invention provide a package or microelectronic assembly in which a microelectronic element, e.g., a semiconductor chip, or stacked arrangement of semiconductor chips, is configured to predominantly provide a memory storage array function. In such microelectronic element, the number of active devices, e.g., transistors, therein that are configured, i.e., constructed and interconnected with other devices, to provide memory storage array function, is greater than the number of active devices that are configured to provide any other function. Thus, in one example, a microelectronic element such as a DRAM chip may have memory storage array function as its primary or sole function.

Alternatively, in another example, such microelectronic element may have mixed use and may incorporate active devices configured to provide memory storage array function, and may also incorporate other active devices configured to provide another function such as processor function, or signal processor or graphics processor function, among others. In this case, the microelectronic element may still have a greater number of active devices configured to provide the memory storage array function than any other function of the microelectronic element.

Figure 1A:
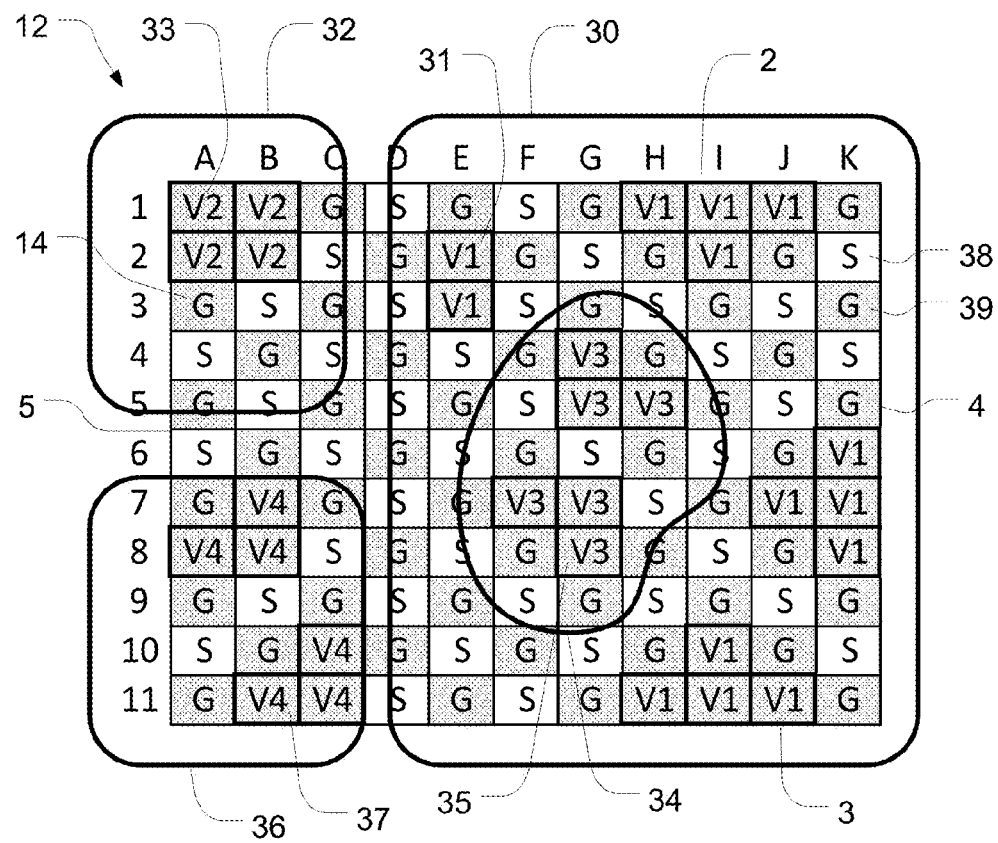
FIG. 1A is a diagrammatic top plan view of a bailout configuration of terminals of a microelectronic package according to an embodiment of the present invention.
Figure 1B:
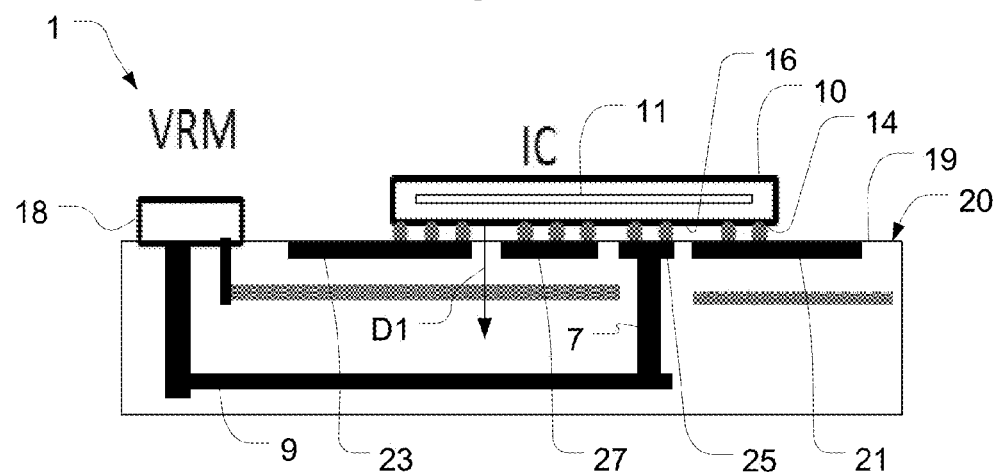
FIG. 1B is a diagrammatic side view of a microelectronic assembly including a microelectronic package having the bailout configuration of FIG. 1A at a major surface thereof.

FIGS. 1A and 1B illustrate an example implementation of a microelectronic assembly 1 including a microelectronic package 10 having a bailout array 12 of terminals 14 at a major surface 16 of the microelectronic package, according to an embodiment herein. The terminals 14 can be configured to electrically couple the microelectronic package 10 to an external component such as a circuit panel 20. As used herein, "terminals" are understood to be configured for connection with a component external to the microelectronic package, such as a circuit panel.

The microelectronic assembly 1 also includes a voltage regulator module 18 (hereinafter, "VRM") configured to provide power to at least some of the terminals 14 of the microelectronic package 10. As used herein, providing "power" to a terminal means providing a predetermined voltage other than ground (e.g., a supply voltage or reference voltage) to the terminal. In some cases, the predetermined voltage may be a DC voltage held constant within an acceptable tolerance. However, in some cases, the predetermined voltage may vary in accordance with a predetermined condition or in accordance with an input to the microelectronic assembly, for example, a condition of an external circuit that drives the voltage to the power plane element of the microelectronic assembly. The microelectronic package 10 and the VRM 18 can both be mounted to a major surface 19 of a support structure such as the circuit panel 20.

In the example shown in FIGS. 1A and 1B, the circuit panel 20 can have four power plane elements 21, 23, 25, and 27 that are configured to provide power to at least some of the terminals 14 of the microelectronic package 10. As used herein, a "power plane element" is configured to carry a voltage other than ground. The microelectronic package 10 may include a microelectronic element 11 having active integrated circuit devices therein, such as an LPDDRx-type microelectronic element having memory storage array function.

The terminals 14 can include first, second, third, and fourth groups 30, 32, 34, and 36, each of which can require an independent power plane element that is not connected with the other power plane elements at least within the microelectronic package 10. The first, second, third, and fourth groups 30, 32, 34, 36 of terminals 14 may contain respective independent sets of power terminals 31, 33, 35, 37, as well as signal terminals 38 and ground terminals 39.

For example, the first group 30 of terminals 14 (shown as including power terminals "V1" in FIG. 1A) can include a first set of power terminals 31 that is electrically coupled to a first power plane element 21. The second group 32 of terminals 14 (shown as including power terminals "V2" in FIG. 1A) can include a second set of power terminals that is electrically coupled to a second power plane element 23. The third group 34 of terminals 14 (shown as including power terminals "V3" in FIG. 1A) can include a third set of power terminals 35 that is electrically coupled to a third power plane element 25. The fourth group 36 of terminals 14 (shown as including power terminals "V4" in FIG. 1A) can include a fourth set of power terminals 37 that is electrically coupled to a fourth power plane element 27. In operation, voltages applied to the power plane elements 21, 23, 25, 27 may be the same or different voltages and may be applied thereto under the same conditions or different conditions.

As can be seen in FIG. 1A, the particular bailout array 12 of terminals 14 can include first, second, third, and fourth groups 30, 32, 34, and 36 of the terminals having particular geometric boundaries. As shown in FIG. 1A, the third group 34 of terminals 14 having a third set of power terminals 35 that is coupled to the third power plane element 25 does not have any terminals disposed adjacent one of the peripheral edges 2, 3, 4, 5 of the area array 12. Therefore, the third group 34 of terminals 14 is an "island region" of terminals. The second peripheral edge 3 can be opposite the first peripheral edge 2, and the fourth peripheral edge 5 can be opposite the third peripheral edge 4, each of the fourth and fifth peripheral edges extending between the first and second peripheral edges.

For the third power plane element 25 to extend from the VRM 18 to the third set of power terminals 35, at least a portion of the third power plane element would typically extend within the area array 12, directly underlying one or more of the signal terminals 38 in a direction D1 perpendicular to the major surface 16 of the microelectronic package 10. As used herein, a power plane element that "extends within an area array" is disposed within a projection of the peripheral edges that define the outer boundary of the area array, when viewed from a vantage point perpendicular to the major surface of the microelectronic package at which the area array is disposed.

Having a portion of one of the power plane elements (e.g., the third power plane element 25) extend within the area array 12, directly underlying one or more of the signal terminals 38, can produce undesirable effects on the performance of the microelectronic package 10. For example, the inventors have recognized that the degree of coupling of the power terminals 35 with the power plane element may be less than desirable at frequencies of interest for operating the assembly 1. Relatively long, narrow conductors such as vertical interconnects 7 in a path between a power conductor or power plane 9 and the terminals 14 provide less efficient coupling than when terminals can be coupled directly to a power plane or through relatively short and broad connections. Poor coupling to power can reduce performance, because power supply voltages are less well-regulated at points within the microelectronic package 10 (i.e., at the terminals 14 and locations further inward within the microelectronic package 10). One or more of these undesirable effects can be at least partially addressed by one or more of the microelectronic assemblies shown and described below with reference to FIGS. 2A through 6.

Figure 2A:
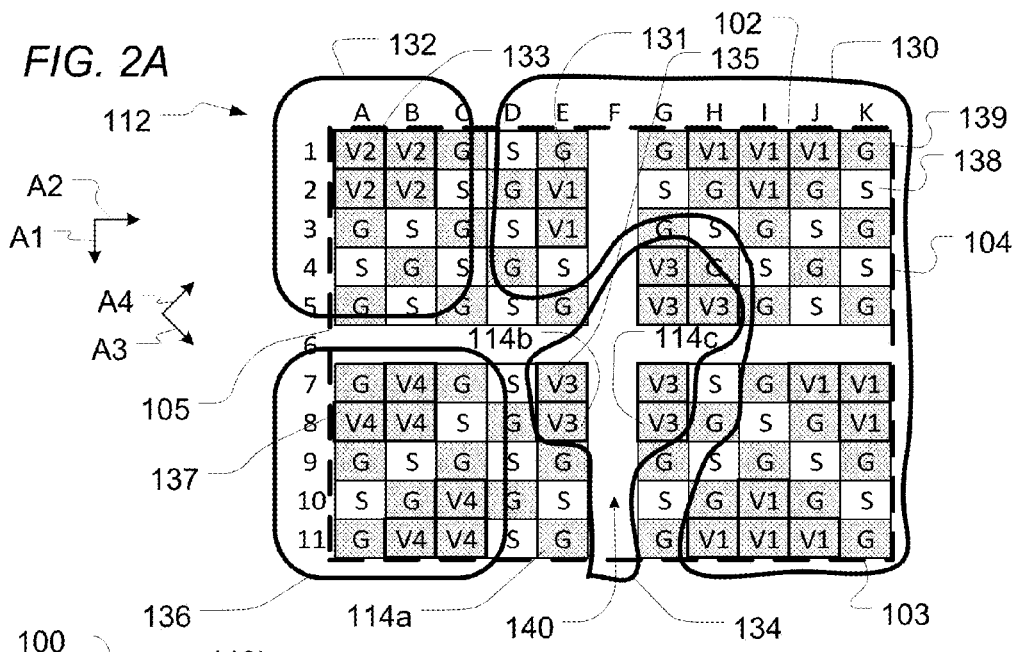
FIG. 2A is a diagrammatic top plan view of a bailout configuration of terminals of a microelectronic package according to another embodiment of the present invention.
Figure 2B:
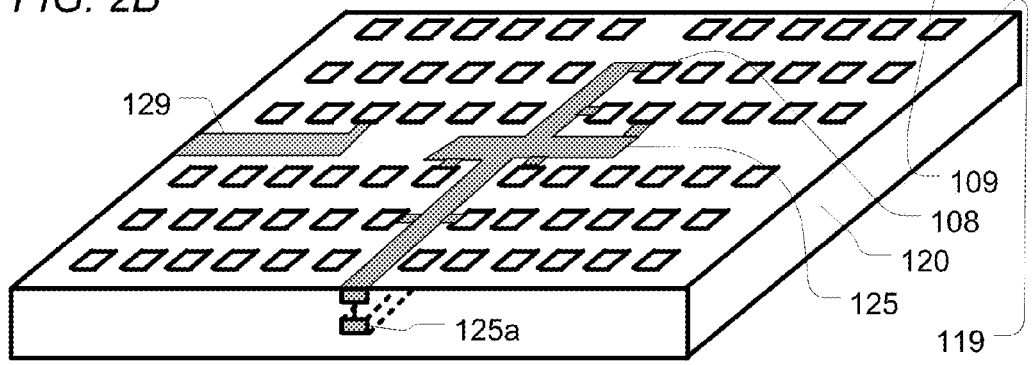
FIG. 2B is a diagrammatic perspective view of a microelectronic assembly including a microelectronic package having the bailout configuration of FIG. 2B at a major surface thereof.

FIGS. 2A and 2B illustrate an example implementation of a microelectronic assembly 100 including a microelectronic package 110 having a bailout array 112 of terminals 114 at a major surface 116 of the microelectronic package, according to an embodiment herein. The terminals 114 can be configured to electrically couple the microelectronic package 110 to an external component such as a circuit panel 120 (FIG. 2B). As shown in FIG. 2B, the terminals 114 of the microelectronic package 110 are configured to be joined to corresponding contacts 108 at a major surface 119 of the circuit panel 120. Joining units 109 comprising, e.g., solder, another wettable metal, a conductive matrix material, etc., may be used to bond the terminals 114 with the contacts 108. Some of the terminals 114 present in the bailout array 112 shown in FIG. 2A have been omitted from FIG. 2B for improved clarity.

The microelectronic assembly 100 can also include a VRM such as the VRM 18 shown in FIG. 1B, the VRM configured to provide power to the at least some of the terminals 114 of the microelectronic package 110. The microelectronic package 110 and the VRM can both be mounted to the major surface 119 of a support structure such as the circuit panel 120. In the example shown in FIGS. 2A and 2B, the circuit panel 120 can have four power plane elements that are configured to provide power to groups of the terminals 114 of the microelectronic package 110.

The microelectronic package 110 can include a substrate 101 and a microelectronic element 111 that is mounted to a first surface 101a of the substrate. The substrate 101 can be a supporting dielectric element, e.g., a tape used in tape automated bonding ("TAB"). In one example, the substrate 101 can consist essentially of a dielectric element having a coefficient of thermal expansion in a plane of the substrate of less than 10 parts per million per degree Centigrade in a plane of the substrate ("ppm/° C.").

The microelectronic element 111 can have active integrated circuit devices therein, and may comprise logic circuitry, a memory storage array, or both. In one example, the microelectronic element 111 can be a dynamic random access memory ("DRAM") chip. In a particular example, the microelectronic element 111 can be an LPDDRx-type microelectronic element having memory storage array function. As shown in FIG. 2B, element contacts 113 at at least one of first and second opposing faces 111a, 111b of the microelectronic element can be electrically coupled to corresponding substrate contacts 115 at at least one of the first surface 101a or a second surface 101b of the substrate 101 opposite the first surface. As shown in FIG. 2B, the second surface 101b of the substrate 101 is also the major surface 116 of the microelectronic package 110.

At least some of the substrate contacts 115 can be electrically connected with at least some of the terminals 114 through traces 117 of the substrate 101. Each trace 117 can have a minimum lateral dimension in a direction parallel to the major surface 116 of the substrate 101. At least some of the element contacts 113 of the microelectronic element 111 can be electrically coupled with at least some of the terminals 114 through the traces 117 and the substrate contacts 115. Not all of the terminals 114 need to be connected with the element contacts 113 of the microelectronic element 111 through the traces 117, as some may have vertical connections only. In a particular example, element contacts 113b at the second face 111b of the microelectronic element 111 can be electrically coupled with substrate contacts 115b through conductive structure extending above surface 111b. In one example, the conductive structure can be wire bonds 106.

The terminals 114 can include first, second, third, and fourth groups 130, 132, 134, and 136, each of which can require an independent power plane element that is not connected with the other power plane elements at least within the microelectronic package 110. The first, second, third, and fourth groups 130, 132, 134, 136 of terminals 114 (shown as including power terminals "V1", "V2, "V3", and "V4", respectively, in FIG. 2A) can contain respective independent sets of power terminals 131, 133, 135, 137, as well as signal terminals 138 and ground terminals 139.

The signal terminals 138 and the ground terminals 139 can collectively be referred to as other terminals 114a. The other terminals 114a can provide signals, ground, or can have any other function other than providing power. In one example, each of the power plane elements (e.g., the third power plane element 125) can be electrically isolated from all of the other terminals 114a. In one example, at least some of the other terminals 114a can be configured to carry data signals for at least one of: input to the microelectronic element 111 for input to a memory storage array thereon, or output from the microelectronic element.

Similar to the embodiment shown in FIG. 1A, each of the first, second, third, and fourth groups 130, 132, 134, and 136 of the terminals 114 can be electrically coupled to a corresponding one of first, second, third, and fourth power plane elements, respectively. However, for simplicity, only the third power plane element 125 is shown in FIG. 2B. The third power plane element 125 can have a minimum lateral dimension in a direction parallel to the major surface 116 of the substrate 101 substantially greater than the minimum lateral dimension of each of the traces 117.

As can be seen in FIG. 2A, the particular bailout array 112 of terminals 114 can include first, second, third, and fourth groups 130, 132, 134, and 136 of the terminals having particular geometric boundaries. As shown in FIG. 2A, the third group 134 of terminals 114 having a third set of power terminals 135 that is coupled to the third power plane element 125 does not have any terminals disposed adjacent one of the peripheral edges 102, 103, 104, 105 of the area array 112. Therefore, the third group 134 of terminals 114 is an "island region" of terminals.

The second peripheral edge 103 can be opposite the first peripheral edge 102, and the fourth peripheral edge 105 can be opposite the third peripheral edge 104, each of the fourth and fifth peripheral edges extending between the first and second peripheral edges. As shown in FIG. 2A, each one of the third set of power terminals 135 can be separated from each of the peripheral edges 102, 103, 104, and 105 by two or more of the other terminals 114a.

For the third power plane element 125 to extend from the VRM to the third set of power terminals 135, a continuous gap 140 is provided between at least some adjacent ones of the terminals 114. The continuous gap 140 extends between adjacent ones of the terminals 114 inwardly from at least one of the peripheral edges 102, 103, 104, 105 in a direction parallel to the major surface 116 of the microelectronic package 110. As shown in FIGS. 2A and 2B, the continuous gap 140 extends inwardly from each of the peripheral edges 102, 103, 104, and 105, but that need not be the case. In one example, the continuous gap can extend inwardly from only one of the peripheral edges 102, 103, 104, 105.

In a particular embodiment, the continuous gap can extend inwardly from two of the peripheral edges (e.g., the first and second peripheral edges 102 and 103), and the third power plane element 125 can extend from the third power terminals 135 at least to both of the two peripheral edges from which the continuous gap extends. In such an example, the third power terminals 135 can be separated from both of the two peripheral edges by two or more of the other terminals 114a.

As shown in FIGS. 2A and 2B, the continuous gap 140 extends within the area array in a plurality of transverse directions parallel to the major surface 116 of the microelectronic package, but that need not be the case. In another example (e.g., FIG. 5), a continuous gap can extend within the area array in a straight line.

The terminals 114 on opposite sides of the gap 140 (e.g., terminals 114b, 114c) can be spaced from one another by at least 1.5 times a minimum pitch of the terminals. In a particular example, the terminals 114b on a first side of the gap 140 can include a first portion of the third power terminals 135, and the terminals 114c on a second side of the gap opposite the first side can include a second portion of the third power terminals, such that the third power terminals are split with some on each of the opposite sides of the gap. In a particular example, the terminals 114 on opposite sides of the gap 140 can be spaced from one another by at most 2.5 times the minimum pitch of the terminals.

As can be seen in FIG. 2B, at least a portion of the third power plane element 125 extends within the gap 140 from the peripheral edge 103 of the area array 112 at least to the third set of power terminals 135. As used herein, an element (power plane element, capacitor) that "extends within a gap" is disposed within a projection of an outer boundary of the gap when viewed from a vantage point perpendicular to the surface of the substrate. For example, as shown in FIG. 2B, at least a portion of the third power plane element 125 directly underlies the gap 140 in a direction D1 perpendicular to the major surface 116 of the microelectronic package 110.

In the embodiment shown in FIG. 2B, the third power plane 125 does not extend within any part of the area array 112 that is not within the gap 140. That is, the portion of the third power plane 125 that is disposed within a projection of peripheral edges 102, 103, 104, 105 of the area array 112 (when viewed from a vantage point perpendicular to the major surface 116 of the microelectronic package 110) is only present within the outer boundary of the gap 140, not within other regions of the area array that lie between the outer boundary of the gap and one of the peripheral edges of the area array. This also means that in this embodiment, the third power plane 125 does not directly underlie any of the signal terminals 138.

In a particular example none of the power plane elements (e.g., the first, second, third, or fourth power plane elements) may extend within any part of the area array 112 that is not within the gap 140. Such an arrangement can help improve coupling between the power plane elements and the terminals through connections that tend to be direct or through shorter, broader connections than in the FIG. 1B example described above.

As can be seen in FIG. 2B, at least a portion of an additional power plane element 129 can extend within the gap 140 from at least one of the peripheral edges of the area array 112 to at least one of the power terminals 131, 133, 135, 137. The additional power plane element 129 can be the first, second, or fourth power plane element, or it can be another third power plane element that is electrically coupled to at least one of the third power terminals 135. The additional power plane element 129 can have a minimum lateral dimension in a direction parallel to the major surface 116 of the substrate 101 substantially greater than the minimum lateral dimension of each of the traces 117.

The additional power plane element 129 can be electrically coupled to at least one of the power terminals 131, 133, 135, 137, each of such power terminals that is electrically coupled to the additional power plane element being separated from all of the peripheral edges 102, 103, 104, 105 of the area array 112 by two or more of the other terminals 114a. The additional power plane element 129 can be electrically insulated from the third power plane element.

As shown in FIG. 2B, the third power plane element 125 can be located at the major surface 119 of the circuit panel 120. The third power terminals 135 can be configured to be joined to corresponding contacts 108 of the circuit panel 120 that are electrically coupled to the third power plane element 125. When the microelectronic package 110 is mounted to the circuit panel 120, the third power terminals 135 are joined to the contacts 108 of the circuit panel, thereby electrically connecting the third power plane element with the third power terminals, and thereby positioning the third power plane element so that it extends within the gap 140 from at least the peripheral edge 103 of the area array 112 at least to the third power terminals.

In other examples, the third power plane element need not be located at the major surface 119 of the circuit panel 120. In one embodiment, the third power plane element can be located within the circuit panel 120 below the major surface 119, for example, at the location indicated as 125a.

In another embodiment, the third power plane element can be located at the major surface 116 of the microelectronic package, at the location indicated as 125b. Such a third power plane element 125b can be coplanar with the terminals 114, and such a third power plane element 125b can be coplanar with at least some of the traces 117. In one example, the third power plane element can be located within the substrate 102 between the first and second surfaces 101a, 101b of the substrate, at the location indicated as 125c. Such a third power plane element 125c can be coplanar with at least some of the traces 117.

Although FIGS. 2A and 2B are shown and described as having four independent sets of power terminals 131, 133, 135, 137 and four corresponding independent power plane elements, that need not be the case. In one example, the microelectronic assembly 100 can have any number of sets of power terminals and any number of corresponding independent power plane elements extending with one or more continuous gaps 140 as described above with reference to the third power plane element 125.

In a particular embodiment, all of the power terminals 131, 133, 135, and 137 in the microelectronic package 110 can each be in a "clustered" configuration with at least one other power terminal electrically connected with the same power plane element. As used herein, all of the power terminals in a microelectronic package are in a "clustered" configuration if, each power terminal is either in: (i) a group of two power terminals that are contiguously adjacent one another in vertical or horizontal orthogonal directions (A1, A2 in FIG. 2A)

or diagonal directions (A3, A4 in FIG. 2A); or (ii) a group of three or more power terminals that are all contiguously adjacent to one another in orthogonal or diagonal directions, where each of the three or more power terminals is directly adjacent to at least one other power terminal in the group in an orthogonal direction (A1, A2).

For example, in the example shown in FIG. 2A, all of the power terminals 131, 133, 135, and 137 in the microelectronic package 110 are in a "clustered" configuration with at least one other power terminal electrically connected with the same power plane element. As can be seen in FIG. 2A, the power terminals 131 indicated by "V1" are shown in four separate "clustered" groups of power terminals. One of the groups has only two contiguously adjacent power terminals, which are adjacent one another in a vertical direction A1, and the other three groups of contiguously adjacent power terminals have power terminals that are each adjacent at least one other power terminals in its group in at least one of the orthogonal directions A1, A2.

The power terminals 133 indicated by "V2" are shown in a single "clustered" group of four contiguously adjacent power terminals, each adjacent at least one other power terminal in its group in at least one of the orthogonal directions A1, A2. The power terminals 135 indicated by V3 are shown in three separate "clustered" groups of power terminals, two groups of two power terminals contiguously adjacent one another in the vertical direction A1, and one group of three contiguously adjacent power terminals, each adjacent at least one other power terminal in its group in at least one of the orthogonal directions A1, A2. The power terminals 137 indicated by V4 are shown in two separate "clustered" groups of power terminals each having three contiguously adjacent power terminals, each terminal in each clustered group being adjacent at least one other power terminal in its group in at least one of the orthogonal directions A1, A2.

Figure 3:
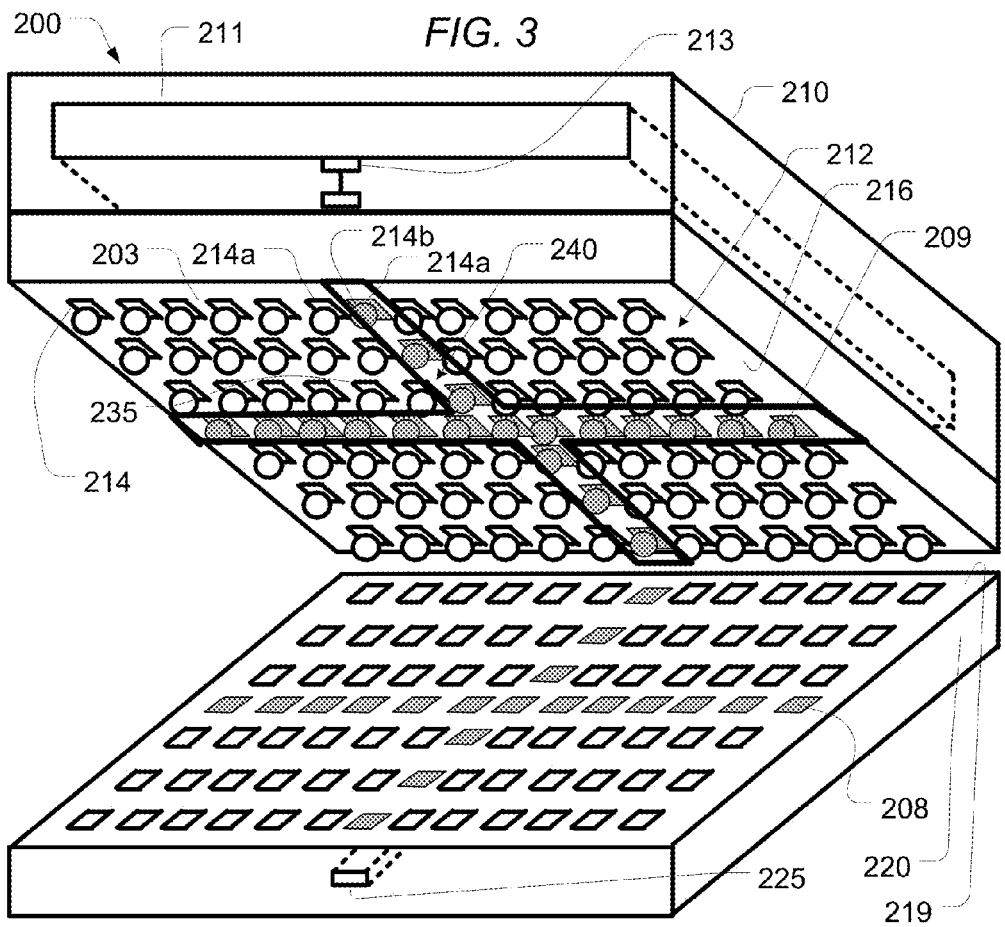
FIG. 3 is a diagrammatic perspective view of an embodiment of a microelectronic assembly that is a variation of the microelectronic assembly of FIG. 2B.

FIG. 3 illustrates an example implementation of a microelectronic assembly 200 that is a variation of the microelectronic assembly 100 of FIGS. 2A and 2B. The microelectronic assembly 200 is similar to the microelectronic assembly 100 of FIGS. 2A and 2B, except that the area array 212 does not have a continuous gap extending between adjacent ones of the terminals 214. Instead of a continuous gap, the other terminals 214a include no-connect terminals 214b disposed at relative positions of the area array 212 so as to form a continuous region 240 extending inwardly from at least one of the peripheral edges (e.g., the second peripheral edge 203) in a direction parallel to the major surface 216 of the microelectronic package 210.

As used herein, a "no-connect terminal" of a microelectronic package means a terminal that is not connected in any electrical path, e.g., path for conducting information to any microelectronic element, e.g., semiconductor chip, within the microelectronic package, whether or not there is ever any information present on such no-connect terminal. Therefore, the no-connect terminals 214b within the continuous region 240 are not electrically coupled to the element contacts 213 of the microelectronic element 211.

In the example shown in FIG. 3, the third power plane element 225 extends within the continuous region 240 from at least the second peripheral edge 203 at least to the third power terminals 235, each third power terminal being separated from the peripheral edge by two or more of the other terminals 214a. As used herein, a power plane element that "extends within a region" is disposed within a projection of the peripheral edges that define the outer boundary of the region, when viewed from a vantage point perpendicular to the major surface of the microelectronic package at which the region is disposed.

Although the no-connect terminals 214b within the continuous region 240 are shown in FIG. 3 as having joining units 209 deposited thereon for joining the no-connect terminals with corresponding contacts 208 at the major surface 219 of the circuit panel 220, that need not be the case. In one example, the no-connect terminals 214b may be devoid of joining units 209 when the microelectronic package 210 is joined with the circuit panel 220, so that no electrical connections are made between the no-connect terminals and the corresponding ones of the circuit panel contacts 208.

Figure 4:
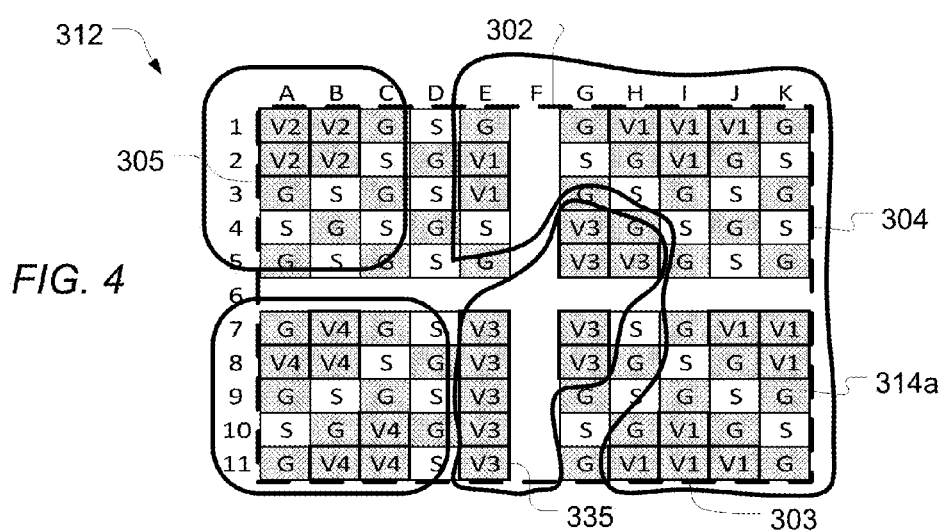
FIG. 4 is a diagrammatic top plan view of an embodiment of a bailout configuration of terminals that is a variation of the bailout configuration of FIG. 2A.

FIG. 4 illustrates an example implementation of a bailout configuration 312 that is a variation of the bailout configuration 112 of the microelectronic assembly 100 of FIGS. 2A and 2B. The bailout configuration 312 can be used in the microelectronic assembly 100 of FIGS. 2A and 2B in place of the bailout configuration 112. The bailout configuration 312 is similar to the bailout configuration 112 of FIGS. 2A and 2B, except that one or more of the third set of power terminals 335 can be disposed adjacent one or more of the peripheral edges 302, 303, 304, 305, and that one or more of the third set of power terminals can be separated from the peripheral edges by less than two of the other terminals 314a.

Figure 5:
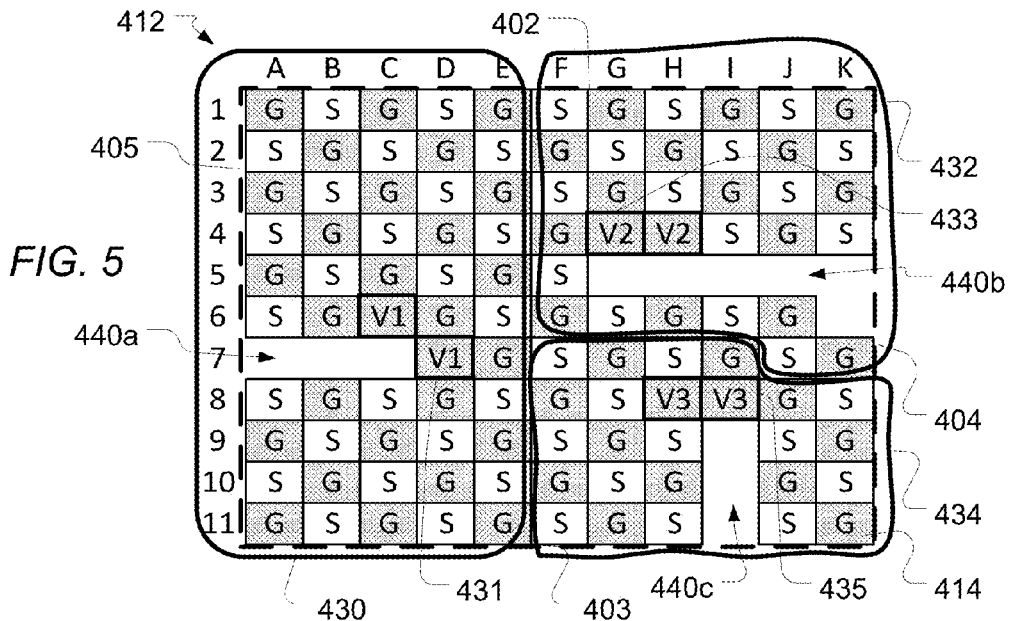
FIG. 5 is a diagrammatic top plan view of another embodiment of a bailout configuration of terminals that is a variation of the bailout configuration of FIG. 2A.

FIG. 5 illustrates an example implementation of a bailout configuration 412 that is a variation of the bailout configuration 112 of the microelectronic assembly 100 of FIGS. 2A and 2B. The bailout configuration 412 can be used in the microelectronic assembly 100 of FIGS. 2A and 2B in place of the bailout configuration 112. The bailout configuration 412 is similar to the bailout configuration of FIGS. 2A and 2B, except that the area array 412 has three continuous gaps.

Each of the continuous gaps 440a, 440b, 440c can extend from at least one of the peripheral edges 402, 403, 404, 405 to a respective independent set of power terminals 431, 433, 435 within a respective group 430, 432, 434 of the terminals 414. Each of the three continuous gaps 440a, 440b, 440c can have a separate power plane element extending within the respective gap that is not connected with the other power plane elements at least within the microelectronic package. Although as shown in FIG. 5, each of the continuous gaps 440a, 440b, 440c extends in a straight line from one of the peripheral edges 402, 403, 404, 405, that need not always be the case.

Figure 6:
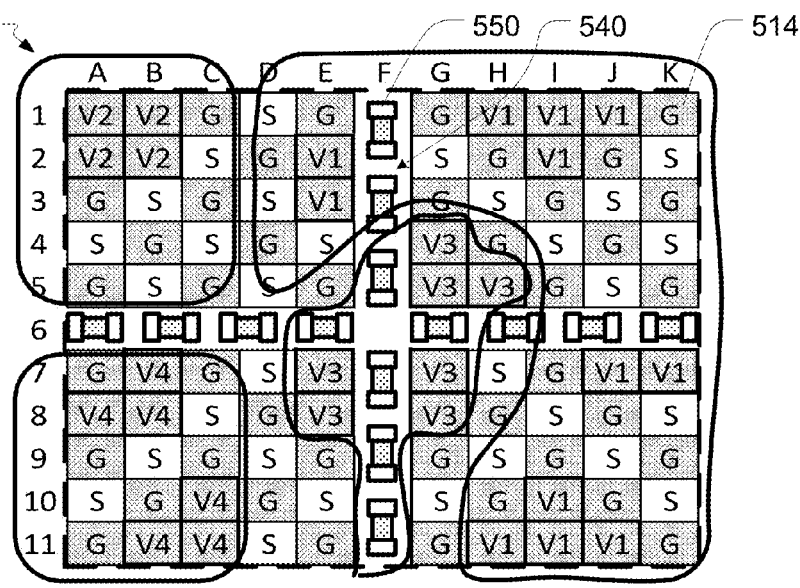
FIG. 6 is a diagrammatic top plan view of yet another embodiment of a bailout configuration of terminals that is a variation of the bailout configuration of FIG. 2A.

FIG. 6 illustrates an example implementation of a bailout configuration 512 that is a variation of the bailout configuration 112 of the microelectronic assembly 100 of FIGS. 2A and 2B. The bailout configuration 512 can be used in the microelectronic assembly 100 of FIGS. 2A and 2B in place of the bailout configuration 112. The bailout configuration 512 is similar to the bailout configuration of FIGS. 2A and 2B, except that the area array 512 at least one decoupling capacitor 550 electrically coupled to contacts of the substrate within the continuous gap 540. As shown in FIG. 6, a plurality of decoupling capacitors 550 may be disposed through the continuous gap 540 between adjacent ones of the terminals 514.

Figure 7:
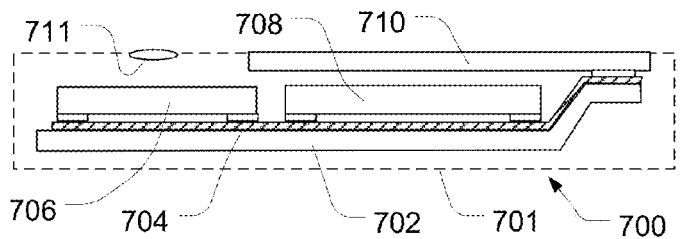
FIG. 7 is a schematic depiction of a system according to one embodiment of the invention.

The microelectronic packages and microelectronic assemblies described above with reference to FIGS. 1A through 6 above can be utilized in construction of diverse electronic systems, such as the system 700 shown in FIG. 7. For example, the system 700 in accordance with a further embodiment of the invention includes a plurality of modules or components 706 such as the microelectronic packages or microelectronic assemblies as described above, in conjunction with other electronic components 708, 710 and 711.

In the exemplary system 700 shown, the system can include a circuit panel, motherboard, or riser panel 702 such as a flexible printed circuit board, and the circuit panel can include numerous conductors 704, of which only one is depicted in FIG. 7, interconnecting the modules or components 706, 708, 710 with one another. Such a circuit panel 702 can transport signals to and from each of the microelectronic packages and/or microelectronic assemblies included in the system 700. However, this is merely exemplary; any suitable structure for making electrical connections between the modules or components 706 can be used.

In a particular embodiment, the system 700 can also include a processor such as the semiconductor chip 708, such that each module or component 706 can be configured to transfer a number N of data bits in parallel in a clock cycle, and the processor can be configured to transfer a number M of data bits in parallel in a clock cycle, M being greater than or equal to N.

In the example depicted in FIG. 7, the component 708 is a semiconductor chip and component 710 is a display screen, but any other components can be used in the system 700. Of course, although only two additional components 708 and 711 are depicted in FIG. 7 for clarity of illustration, the system 700 can include any number of such components.

Modules or components 706 and components 708 and 711 can be mounted in a common housing 701, schematically depicted in broken lines, and can be electrically interconnected with one another as necessary to form the desired circuit. The housing 701 is depicted as a portable housing of the type usable, for example, in a cellular telephone or personal digital assistant, and screen 710 can be exposed at the surface of the housing. In embodiments where a structure 706 includes a light-sensitive element such as an imaging chip, a lens 711 or other optical device also can be provided for routing light to the structure. Again, the simplified system shown in FIG. 7 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic package, comprising:
    a substrate comprising a dielectric element having a surface, terminals comprising at least first power terminals and other terminals in an area array at the surface, contacts coupled with the terminals, and traces electrically coupling at least some of the terminals with at least some of the contacts, each trace having a minimum lateral dimension parallel to the surface, the substrate further comprising a power plane element electrically coupled to the first power terminals and having a minimum lateral dimension parallel to the surface substantially greater than the minimum lateral dimension of each trace; and
    a microelectronic element having element contacts electrically coupled with the terminals through the traces and the contacts of the substrate,
    wherein the area array has a peripheral edge and a continuous gap between the terminals extending inwardly from the peripheral edge in a direction parallel to the surface, the terminals on opposite sides of the gap being spaced from one another by at least 1.5 times a minimum pitch of the terminals, and the power plane element extends within the gap from at least the peripheral edge at least to the first power terminals, each first power terminal separated from the peripheral edge by two or more of the other terminals.

2. The microelectronic package as claimed in claim 1, wherein the power plane element and the traces are coplanar.

3. The microelectronic package as claimed in claim 1, wherein the terminals on opposite sides of the gap are spaced from one another by at most 2.5 times the minimum pitch of the terminals.

4. The microelectronic package as claimed in claim 1, wherein the peripheral edge is a first peripheral edge, the area array has a second peripheral edge opposite the first peripheral edge and third and fourth opposite peripheral edges each extending between the first and second peripheral edges, and each first power terminal is separated from each of the peripheral edges by two or more of the other terminals.

5. The microelectronic package as claimed in claim 1, wherein all of the first power terminals are each in a clustered configuration with at least one other one of the first power terminals that are electrically connected to the power plane element.

6. The microelectronic package as claimed in claim 1, wherein the power plane element is electrically isolated from all of the other terminals.

7. The microelectronic package as claimed in claim 1, wherein at least some of the other terminals are configured to carry data signals for at least one of: input to the microelectronic element for input to a memory storage array thereon, or output from the microelectronic element.

8. The microelectronic package as claimed in claim 1, wherein a first group of the first power terminals are disposed on a first side of the gap, and a second group of the first power terminals are disposed on a second side of the gap opposite first side.

9. The microelectronic package as claimed in claim 1, wherein the gap extends within the area array in a straight line.

10. The microelectronic package as claimed in claim 1, wherein the gap extends from the peripheral edge of the area array to a second peripheral edge of the area array, the power plane element further extends from the first power terminals at least to the second peripheral edge, and each first power terminal is separated from the second peripheral edge by two or more of the other terminals.

11. The microelectronic package as claimed in claim 1, further comprising a decoupling capacitor electrically coupled to the contacts of the substrate within the gap.

12. The microelectronic package as claimed in claim 1, wherein the power plane element is a first power plane element and the terminals further include second power terminals, the substrate further including a second power plane element electrically coupled to the second power terminals and having a minimum lateral dimension parallel to the surface substantially greater than the minimum lateral dimension of each trace, and
    wherein the second power plane element extends from at least the second power terminals to at least one of: the peripheral edge, or another peripheral edge of the area array, each second power terminal separated from all of the peripheral edges of the area array by two or more of the other terminals, and the second power plane element is electrically insulated from the first power plane element.

13. The microelectronic package as claimed in claim 12, wherein the second power plane element extends within the gap.

14. The microelectronic package as claimed in claim 12, wherein the gap is a first gap, and the area array has a second continuous gap between the terminals extending inwardly in a direction parallel to the surface from the at least one of: the peripheral edge, or another peripheral edge of the area array, the terminals on opposite sides of the second gap being spaced from one another by at least 1.5 times the minimum pitch of the terminals, and the second power plane element extends within the second gap.

15. A system comprising the microelectronic package as claimed in claim 1 and one or more other electronic components electrically connected to the microelectronic package.

16. The system as claimed in claim 15, further comprising a housing, the microelectronic package and the other electronic components being mounted to the housing.

17. A microelectronic package, comprising:
a substrate comprising a dielectric element having a surface, terminals comprising at least first power terminals and other terminals in an area array at the surface, contacts coupled with the terminals, and traces electrically coupling at least some of the terminals with at least some of the contacts, each trace having a minimum lateral dimension parallel to the surface, the substrate further comprising a power plane element electrically coupled to the first power terminals and having a minimum lateral dimension parallel to the surface substantially greater than the minimum lateral dimension of each trace; and
a microelectronic element having element contacts electrically coupled with the terminals through the traces and the contacts of the substrate,
wherein the area array has a peripheral edge, the other terminals include no-connect terminals disposed at relative positions of the area array so as to form a continuous region extending inwardly from the peripheral edge in a direction parallel to the surface, and the power plane element extends within the region from at least the peripheral edge at least to the first power terminals, each first power terminal separated from the peripheral edge by two or more of the other terminals.

18. A microelectronic package, comprising:
a substrate comprising a dielectric element having a surface, terminals comprising at least first power terminals and other terminals in an area array at the surface, contacts coupled with the terminals, and traces electrically coupling at least some of the terminals with at least some of the contacts, each trace having a minimum lateral dimension parallel to the surface; and
a microelectronic element having element contacts electrically coupled with the terminals through the traces and the contacts of the substrate,
wherein the area array has a peripheral edge and a continuous gap between the terminals extending inwardly from the peripheral edge in a direction parallel to the surface, the terminals on opposite sides of the gap being spaced from one another by at least 1.5 times a minimum pitch of the terminals, each first power terminal separated from the peripheral edge by two or more of the other terminals,
wherein the first power terminals are configured to be joined to contacts of a circuit panel that are electrically coupled to a power plane element that extends within the gap from at least the peripheral edge at least to the first power terminals, the power plane element having a minimum lateral dimension parallel to the surface substantially greater than the minimum lateral dimension of each trace.

19. The microelectronic package as claimed in claim 18, wherein the terminals on opposite sides of the gap are spaced from one another by at most 2.5 times the minimum pitch of the terminals.

20. The microelectronic package as claimed in claim 18, wherein the peripheral edge is a first peripheral edge, the area array has a second peripheral edge opposite the first peripheral edge and third and fourth opposite peripheral edges each extending between the first and second peripheral edges, and each first power terminal is separated from each of the peripheral edges by two or more of the other terminals.

21. A microelectronic assembly comprising the circuit panel and the microelectronic package of claim 18, the microelectronic package being mounted to the circuit panel so that the first power terminals are joined to the contacts of the circuit panel, the power plane element extending within the gap from at least the peripheral edge at least to the first power terminals.

22. The microelectronic assembly as claimed in claim 21, wherein the power plane element is a first power plane element and the terminals further include second power terminals, the circuit panel further including a second power plane element electrically coupled to the second power terminals and having a minimum lateral dimension parallel to the surface of the substrate substantially greater than the minimum lateral dimension of each trace,
wherein the second power plane element extends from at least the second power terminals to at least one of: the peripheral edge, or another peripheral edge of the area array, each second power terminal separated from all of the peripheral edges of the area array by two or more of the other terminals, and the second power plane element is electrically insulated from the first power plane element.

* * * * *